(12) United States Patent
Mano

(10) Patent No.: US 6,373,744 B1
(45) Date of Patent: Apr. 16, 2002

(54) FERROELECTRIC MEMORY

(75) Inventor: Yoshitaka Mano, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/911,831

(22) Filed: Jul. 25, 2001

(30) Foreign Application Priority Data

Jul. 26, 2000 (JP) ........................................ 2000-224665

(51) Int. Cl.[7] .............................................. G11C 11/22
(52) U.S. Cl. .................... 365/145; 365/200; 365/189.09
(58) Field of Search ................................ 365/145, 200, 365/189.09, 228, 229

(56) References Cited

U.S. PATENT DOCUMENTS 5,734,204 A * 3/1998 Sobue ........................ 307/65
6,226,224 B1 * 5/2001 Banba et al. ................ 365/276

FOREIGN PATENT DOCUMENTS

| JP | 11086566 | 3/1999 |
| WO | WO97/07408 | 2/1997 |

* cited by examiner

*Primary Examiner*—Vu A. Le
(74) *Attorney, Agent, or Firm*—Parkhurst & Wendel, L.L.P.

(57) ABSTRACT

To provide a ferroelectric memory, in which data can be positively protected even in an event of fluctuations in process parameter, time can be shortened for a reliability estimation test, and it is possible to avoid device breakage resulted from the test. A source voltage VDD is detected by using a source voltage detection circuit having a stable detection level. When a detected voltage RREFA is at or lower than a set detection level VREFA, an external input terminal XEXTCE is deactivated by using an output signal of a differential amplifier circuit to protect data. Thus, it is possible to protect data with stability.

8 Claims, 12 Drawing Sheets

US 6,373,744 B1

FERROELECTRIC MEMORY

FIELD OF THE INVENTION

The present invention relates to a semiconductor memory and concerns a nonvolatile ferroelectric memory for storing data by using characteristics of a ferroelectric capacitor.

BACKGROUND OF THE INVENTION

In recent years, of nonvolatile memories, a nonvolatile ferroelectric memory has become a focus of attention. The nonvolatile ferroelectric memory stores data by using characteristics of a ferroelectric capacitor, dramatically improves the number of times of rewriting as compared with a flash memory and an EEPROM, and increases a reading speed and a writing speed with a low source voltage.

First, the following will briefly describe operations of the ferroelectric memory having the above characteristics.

FIG. 10 is a circuit block diagram showing a configuration of a conventional ferroelectric memory. As shown in FIG. 10, the ferroelectric memory is constituted by a memory M10 including a memory cell MC10 and a precharge circuit PC10, and a memory control section MS10 for controlling the memory cell MC10 and the precharge circuit PC10. The memory cell MC10 has a 2T (transistor)/2C (capacitor) configuration. FIG. 11 is a timing chart showing control signals in the memory control section MS10 of the ferroelectric memory shown in FIG. 10.

In FIGS. 10 and 11, reference character XEXTCE denotes an external input control signal, reference character INTCE denotes an internal circuit control signal, reference character WL denotes a word line, reference characters BL and /BL denote bit lines, reference character CP denotes a cell plate electrode, reference character BP denotes a bit line precharge control signal, reference character SAE denotes a sense amplifier control signal, reference character VSS denotes a ground voltage, reference character SA denotes a sense amplifier, reference numerals CM0 and CM0B denote memory cell capacitors using a ferroelectric material, reference numerals QnWL1, QnWL2, and QnBP0 to QnBP2 denote N-channel MOS transistors, reference numeral 100 denotes a CE initial-stage circuit for producing the internal circuit control signal INTCE from the external input control signal XEXTCE, and reference numeral 101 denotes a control circuit for producing signals WL, CP, BP, and SAE from the internal circuit control signal INTCE.

The bit lines BL and /BL are connected to the sense amplifier SA, and the sense amplifier SA is controlled by the sense amplifier control signal SAE.

The first electrode of the memory cell capacitor CM0 is connected to the bit line BL via the memory cell transistor QnWL1 whose gate electrode is connected to the word line WL.

The second electrode of the memory cell capacitor CM0 is connected the cell plate electrode CP. The first electrode of the memory cell capacitor CM0B, which is paired with the memory cell capacitor CM0, is connected to the bit line /BL via the memory cell transistor QnWL2 whose gate electrode is connected to the word line WL. The second electrode of the memory cell CM0B is connected to the cell plate electrode CP.

Further, the bit lines BL and /BL are connected to each other via the N-channel MOS transistor QnBP0. The bit line BL and the ground voltage VSS, and the bit line /BL and the ground voltage VSS are respectively connected to the N-channel MOS transistors QnBP1 and QnBP2. The gate electrodes of the N-channel MOS transistors QnBP0 to QnBP2 are controlled by the bit line precharge control signal BP.

The memory cell capacitors CM0 and CM0B store a logical state ("1" or "0") of data depending upon an electrical polarization state of ferroelectric capacitors constituting the memory cell capacitors CM0 and CM0B. When a voltage is applied between the electrodes of the memory cell capacitors CM0 and CM0B, the ferroelectric material is polarized in a direction of an electric field.

Referring to FIG. 11, the following will briefly discuss the reading operation of the ferrorelectric memory configured thus.

FIG. 11 is a timing chart showing the control signals for exercising memory control in the conventional ferroelectric memory. As shown in FIG. 11, in an initial state, the external input control signal XEXTCE activated at logical voltage "L" is at logical voltage "H", the internal circuit control signal INTCE is at logical voltage "L", the bit line precharge control signal BP is at logical voltage "H", and the bit lines BL and /BL are at logical voltage "L". Moreover, the word line WL, the cell plate electrode CP, and the sense amplifier control signal SAE are at the ground voltage VSS, which is at logical voltage "L".

Firstly (at timing of time T1), since the external input control signal XEXTCE is set at logical voltage "L", the internal circuit control signal INTCE is changed to logical voltage "H" and the bit line precharge control signal BP is changed to logical voltage "L". Hence, the bit lines BL and /BL are brought into a floating state.

Next, at timing of time T2, the word line WL and the cell plate electrode CP are set at logical voltage "H", and data of the memory cell capacitors CM0 and CM0B is read to the bit lines BL and /BL.

And then, at timing of time T3, the sense amplifier control signal SAE is set at logical voltage "H", data is amplified, the reading operation is started, and data of the memory cell capacitors CM0 and CM0B is rewritten in two states of logical voltage "H" of the cell plate electrode CP after the amplification of data and logical voltage "L" of the cell plate electrode CP.

Next, at timing of time T4, since the sense amplifier control signal SAE is set at logical voltage "L", the operation of the sense amplifier SA is suspended. And then, at timing of time T5, since the bit line precharge control signal BP is set at logical voltage "H", the bit lines BL and /BL return to a logical voltage "L" and a potential across the memory cell is made equal.

Subsequently, at timing of time T6, the word line WL is set at logical voltage "L", the bit lines BL and /BL and the memory cell are made unconnected with each other and are brought into the initial state.

As described above, in addition to during the writing operation, the ferroelectric memory performs rewriting during and after the reading operation. Further, as compared with a flash memory demanding a high voltage for rewriting data, just because of a difference in potential across the memory cell capacitor, charge is transferred and the rewriting operation is carried out. Thus, it is quite important to protect data from a malfunction even at a low voltage.

Considering the operations when the power is turned on and off on a ferrorelectric memory section (memory section M10 of FIG. 10) and a logical section (memory control section MS10 of FIG. 10) including a microcomputer for controlling the memory section, control signals produced from the microcomputer (logic) section may be undefined. In this case as well, data needs to be protected.

Moreover, considering the timing of suspending the operation, the operation of the microcomputer (logic) section can be immediately suspended without any problems. However, regarding the ferroelectric memory requiring rewriting after reading, data needs protection during the operation.

Therefore, even at a voltage other than a guaranteed source voltage, particularly at a low voltage when the power is turned on and off, it is not possible to maintain nonvolatile characteristics unless data is protected by exercising control for avoiding a reading operation and a writing operation based on the relationship between a source voltage and a potential of an external control signal.

Hence, regarding the ferroelectric memory, the presence of a circuit, which detects a source voltage value, prevents a malfunction in response to a detection signal, and protects stored data, is more important than a conventional nonvolatile memory. A source voltage detection circuit configured as below is required as a circuit capable of operating thus.

Referring to FIG. 12, the following will discuss a source voltage detection circuit in the conventional ferroelectric memory.

FIG. 12 is a circuit diagram showing the configuration of the source voltage detection circuit in the conventional ferroelectric memory. In FIG. 12, reference numerals QpA11 to QpA16 denote P-channel MOS transistors, reference numerals QnA11 and QnA12 denote N-channel MOS transistors, reference numerals 111 and 112 denote inverter circuits, reference character VDD denotes a source voltage, and reference character VSS denotes a ground voltage.

The source of the P-channel MOS transistor QpA11 is connected to the source voltage VDD, and the gate and drain thereof are connected to a node N111. The source of the P-channel MOS transistor QpA12 is connected to the source voltage VDD, the gate thereof is connected to the node N111, and the drain thereof is connected to a node N113.

The P-channel MOS transistors QpA14 and QpA15 are connected in series between the node N111 and the node N112, and the N-channel MOS transistor QnA11 connects the node N112 and the ground voltage VSS. The P-channel MOS transistors QpA14 and QpA15, which are connected in series, and the N-channel MOS transistor QnA11 act as resistors.

The inverter circuit 111 connects the node N113 and the ground voltage VSS. The inverter circuit 111 has the node N112 as an input terminal and the node N115 as an output terminal. The inverter circuit 111 has the P-channel MOS transistor QpA13 and the N-channel MOS transistor QnA12 connected in series.

The input terminal of the inverter circuit 112 is connected to the node N115, and a signal VOUT10 is obtained at the output terminal of the inverter circuit 112. The P-channel MOS transistor QpA16 connects the node N115 and the source voltage VDD. The signal VOUT10 is supplied to the gate of the P-channel MOS transistor QpA16.

In the source voltage detection circuit configured thus, the output node VOUT10 judges if a potential is higher or lower than a detected potential. When a potential is below a detected potential, e.g., when the source is turned on or off, an operation such as resetting an internal circuit is carried out.

Regarding the source voltage detection circuit in such a conventional ferroelectric memory, in the case where the P-channel MOS transistors QpA11, QpA14, and QpA15 have a threshold value (Vt) of Vtp1 and the N-channel MOS transistor QnA11 has a threshold value (Vt) of Vtn1, a detected potential is about 3* Vtp1+Vtn1.

Assuming a threshold value (Vt) of the transistor is 0.4 V due to a variation range including variations in process and temperature, it is expected that a detection level is largely varied by (3*0.4+0.4=1.6 V).

Particularly, considering a 3 V-ferroelectric memory in which a source voltage VDD is lowered, a difference is narrowed between a detection level and a lower limit voltage for guaranteeing the operation. Due to variations in process, if a voltage of the detection level is higher, the detection level is set at or higher than a lower voltage limit of the guarantee. When a product specification is not satisfied or when a voltage of the detection level is lower, the detection level is set at a low voltage preventing a normal operation. In the worst case, it is expected that no detection signal is produced. Thus, it is not possible to positively protect data as expected due to fluctuations in threshold value (Vt) of the transistor. The threshold value is changed due to fluctuations in process and temperature.

Besides, regarding the ferroelectric memory, standardization is not made on an entry method (e.g., WCBR method of DRAM) of a special test mode, which is different from a normal operation. However, like an endurance (the number of rewriting times) test, a reliability estimation test requires an extremely long time in a normal operation. Thus, it is necessary to shorten time by entering a test mode being different from the normal one. Further, it is also necessary to avoid device breakage when a high voltage stress is applied.

DISCLOSURE OF THE INVENTION

The present invention is devised to solve the above conventional problems. The object of the present invention is to provide a ferroelectric memory, in which data can be positively protected using a voltage detection signal stabilized at a constant potential by reducing variations in voltage detection level, the variations being resulted from fluctuations in process parameter, and since a reliability estimation test is carried out in a test mode being different from a normal operation, it is possible to shorten time and to prevent device breakage caused by high-voltage stress for evaluating reliability.

The ferroelectric memory of the present invention, in which data is stored by allowing an internal control signal produced based on an external input control signal to conform electrical polarization of a ferroelectric capacitor to a logical state of data, and the stored data is read by the internal control signal, is provided with a memory control section including a divided potential generating circuit for generating a divided potential, which is divided based on a source voltage with a constant ratio; a reference potential generating circuit for generating a constant reference potential, which is independent of the source voltage, according to a predetermined detection level relative to the source voltage; a differential amplifier circuit for outputting logical voltage according to a potential difference between the reference potential and the divided potential; and control signal producing means for producing the internal control signal based on the external input control signal or a logical voltage from the differential amplifier circuit, wherein the memory control section is configured such that when the source voltage is detected as being lower than the detection level based on a logical voltage from the differential amplifier circuit, while the external input control signal is deactivated, the stored data is protected by the internal control signal produced based on a logical voltage from the differential amplifier circuit.

Further, the ferroelectric memory of the present invention, in which data is stored by allowing an internal control signal produced based on an external input control signal to conform electrical polarization of a ferroelectric capacitor to a logical state of data, and the stored data is read by the internal control signal, is provided with a memory control section including a divided potential generating circuit for generating a divided potential, which is divided based on a source voltage with a constant ratio; a reference potential generating circuit for generating a constant reference potential, which is independent of the source voltage, according to a predetermined detection level relative to the source voltage; a differential amplifier circuit for outputting a logical voltage according to a potential difference between the reference potential and the divided potential; power supply detection means for outputting a detection signal of the power supply only for a fixed time after the power is turned on for supplying the source voltage; and control signal producing means for producing the internal control signal based on the external input control signal, the power supply detection signal, or a logical voltage from the differential amplifier circuit, wherein the memory control section is configured such that when the source voltage is detected as being lower than the detection level by a logical voltage from the differential amplifier circuit or when the power supply is detected by the power supply detection signal, while the external input control signal is deactivated, the stored data is protected by the internal control signal produced based on the power supply detection signal or a logical voltage from the differential amplifier circuit.

Moreover, the ferroelectric memory of the present invention is configured such that as a predetermined detection level relative to the source voltage, a detection level is set higher when the power is turned on as compared with when the power is turned off.

Besides, the ferroelectric memory of the present invention is configured such that capacitor elements are connected as additional circuits to the output nodes of the reference potential generating circuit and the divided potential generating circuit.

According to the above configurations, it is possible to protect data with stability by using the source voltage detection circuit for reducing variations in voltage detection level to stabilize the detection level, the variations being resulted from fluctuations in process parameter.

The ferroelectric memory of the present invention, in which data is stored by allowing an internal control signal to conform electrical polarization of a ferroelectric capacitor to a logical state of data, and the stored data is read by the internal control signal, is provided with a memory control section including a divided potential generating circuit for generating a divided potential, which is divided based on a source voltage with a constant ratio; a reference potential generating circuit for generating a constant reference potential, which is independent of the source voltage, according to a predetermined detection level relative to the source voltage; a differential amplifier circuit for outputting logical voltage according to a potential difference between the reference potential and the divided potential; and a test mode entry circuit for outputting a test mode signal as the internal control signal based on a logical voltage from the differential amplifier circuit, the test mode signal allowing the entry of a test mode being different from a normal operation, wherein the memory control section is configured such that when the source voltage is detected as being higher than the detection level based on a logical voltage from the differential amplifier circuit, the entry of the test mode is allowed according to a logical voltage from the differential amplifier circuit.

According to the above configuration, the entry of the test mode is possible without providing a special input terminal.

The ferroelectric memory of the present invention, in which data is stored by allowing an internal control to conform electrical polarization of a ferroelectric capacitor to a logical state of data, and the stored data is read by the internal control signal, is provided with a memory control section including a divided potential generating circuit for generating a divided potential, which is divided based on a source voltage with a constant ratio; a reference potential generating circuit for generating a constant reference potential, which is independent of the source voltage, according to a predetermined detection level relative to the source voltage; a differential amplifier circuit for outputting logical voltage according to a potential difference between the reference potential and the divided potential; and a booster circuit for outputting a boosted voltage signal, which is controlled in a direction of boosting a potential, as the internal control signal based on a logical voltage from the differential amplifier circuit, wherein the memory control section is configured such that when the source voltage is detected as being higher than the detection level based on a logical voltage from the differential amplifier circuit, an output potential of the booster circuit is controlled according to a logical voltage from the differential amplifier circuit.

According to the above configuration, it is possible to prevent excessive stress without providing a special input terminal.

Moreover, the ferroelectric memory of the present invention is configured such that as a predetermined detection level relative to the source voltage, a detection level is set higher when the power is turned on as compared with when the power is turned off.

Besides, the ferroelectric memory of the present invention is configured such that capacitor elements are connected as additional circuits to the output nodes of the reference potential generating circuit and the divided potential generating circuit.

According to the above configurations, the entry of the test mode is possible without providing a special input terminal, and excessive stress can be prevented without providing a special input terminal.

As described above, it is possible to protect data with stability by using a source voltage detection circuit for stabilizing a detection level by reducing variations in voltage detection level that are resulted from fluctuations in process parameter.

Therefore, it is possible to use a voltage detection signal stabilized at a constant potential and to positively protect data.

Further, the entry of a test mode is possible without providing a special input terminal.

Hence, it is possible to shorten time by conducting a reliability estimation test in a test mode being different from a normal operation.

Moreover, it is possible to prevent excessive stress without providing any special input terminal.

Thus, it is possible to avoid device breakage caused by applying a high-voltage stress for estimating reliability.

DESCRIPTION OF THE EMBODIMENTS

Referring to figures, the following will discuss embodiments of the present invention.

Embodiment 1

The following will discuss a ferroelectric memory according to Embodiment 1 of the present invention.

Figure 1:
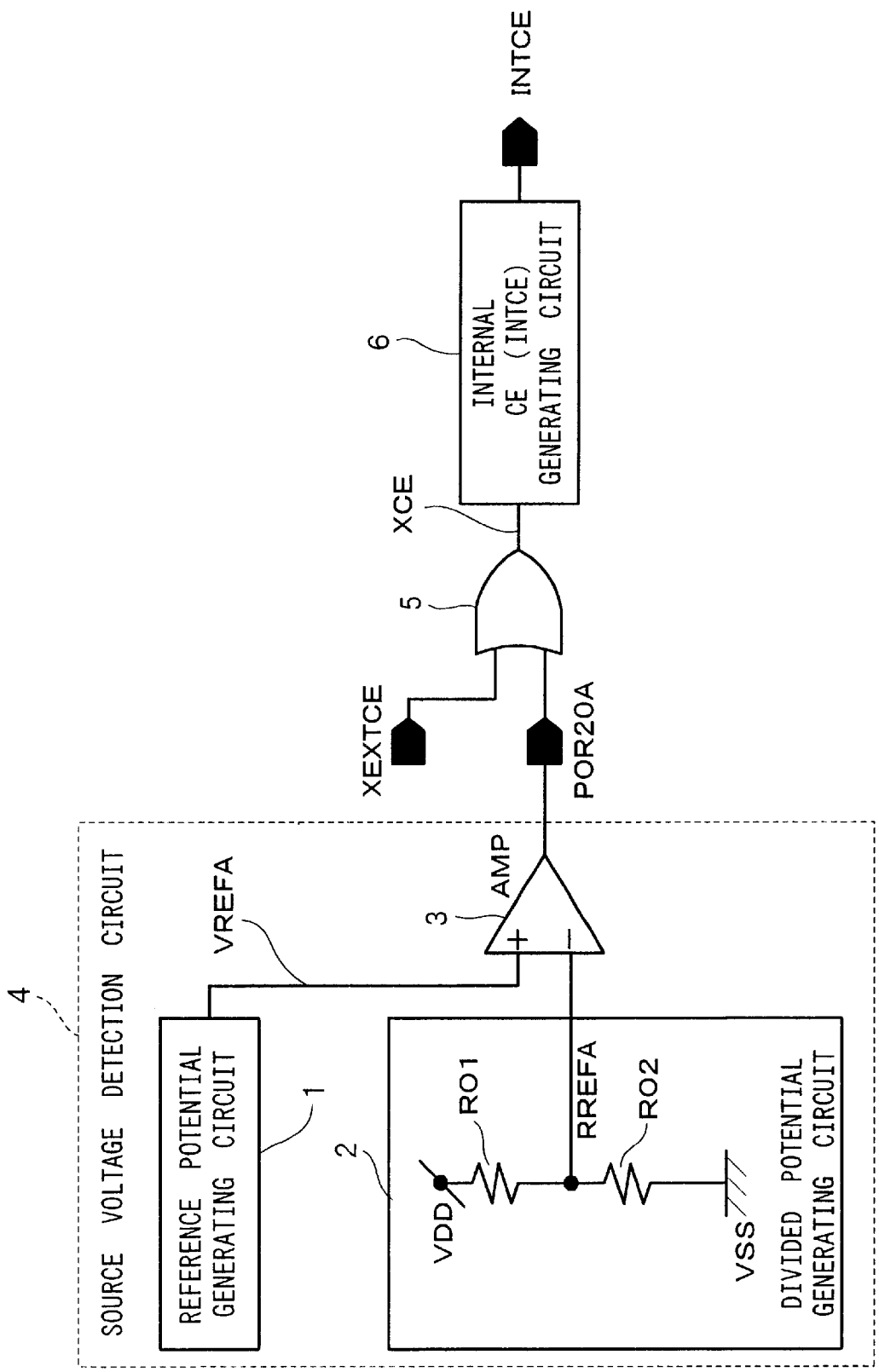
FIG. 1 is a circuit block diagram showing a memory control section in a ferroelectric memory according to Embodiment 1 of the present invention.

FIG. 1 is a circuit block diagram showing a configuration of a memory control section in the ferroelectric memory of Embodiment 1. In FIG. 1, reference numeral 1 denotes a reference potential generating circuit, reference character VREFA denotes a reference potential output node of the reference potential generating circuit 1, reference numeral 2 denotes a divided potential generating circuit for generating a divided potential according to a source voltage VDD, reference character RREFA denotes a divided potential output node of the divided potential generating circuit 2, reference numerals R01 and R02 denote resistance elements, reference character VDD denotes a source voltage, reference character VSS denotes a ground voltage, reference numeral 3 denotes a differential amplifier circuit (AMP) for amplifying a potential difference between the output node VREFA of the reference potential generating circuit 1 and the output node RREFA of the divided potential generating circuit 2, reference numeral POR20A denotes an output node of the differential amplifier circuit 3, reference numeral 4 denotes a source voltage detection circuit including the circuits 1, 2, and 3, reference character XEXTCE denotes an external input control signal for activating the internal circuit at a logical voltage of "L" level, reference numeral 5 denotes an OR circuit for outputting an OR of the external input control signal XEXTCE and the output node POR20A, reference character XCE denotes an output node of the OR circuit 5, reference character INTCE denotes an internal circuit control signal for controlling the internal circuit, and reference numeral 6 denotes an internal CE generating circuit for producing the internal circuit control signal INTCE from the output node XCE.

The resistance element R01 has an end connected to the source voltage VDD and the other end connected to the output node RREFA. The resistance element R02 has an end connected to the ground voltage VSS and the other end connected to the output node RREFA.

Figure 2:
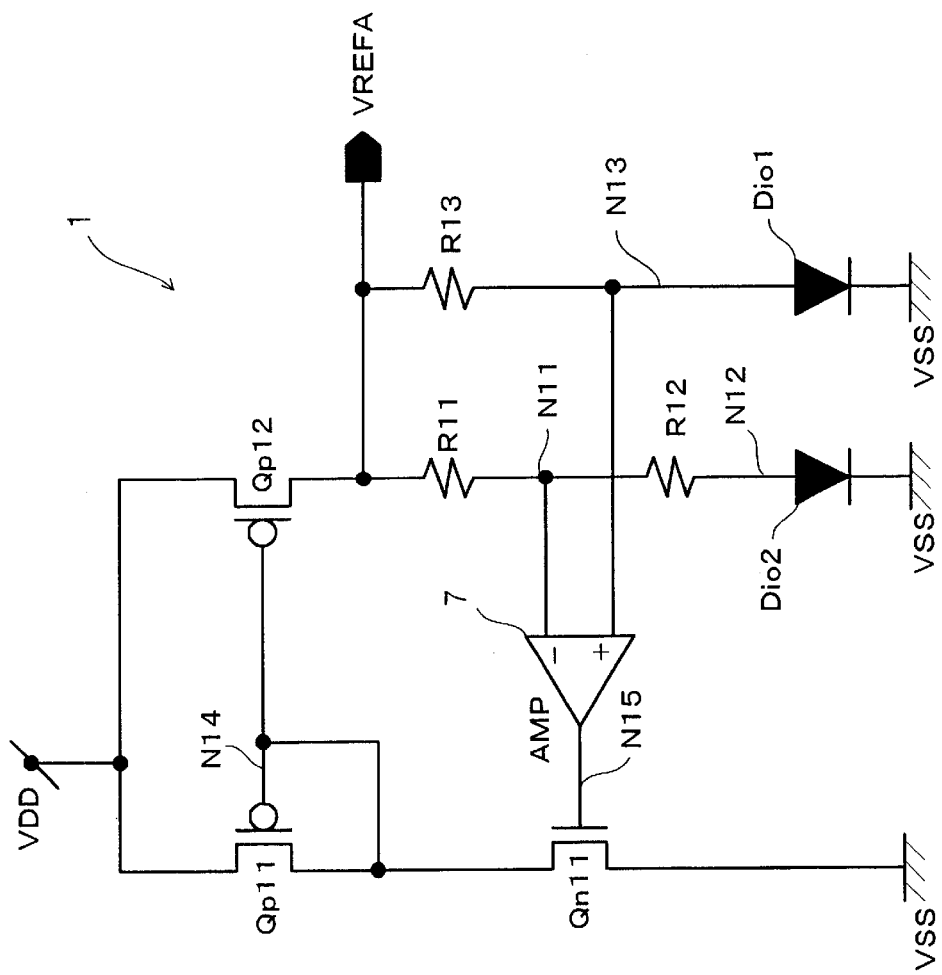
FIG. 2 is a circuit block diagram showing an example of a configuration of a reference potential generating circuit according to Embodiment 1.

FIG. 2 is a circuit block diagram showing a band gap reference circuit as an example of a configuration of the reference potential generating circuit 1 in the memory control section of FIG. 1. In FIG. 2, reference numerals Qp11 and Qp12 denote P-channel CMOS transistors, reference numeral Qn11 denotes an N-channel CMOS transistor, reference numerals R11, R12, and R13 denote resistance elements, reference number 7 denotes a differential amplifier circuit for amplifying a potential difference between internal nodes N11 and N13, reference numerals Di01 and Di02 denote diodes, reference character VDD denotes a source voltage, and reference character VSS denotes a ground voltage.

The source of the P-channel CMOS transistor Qp11 is connected to the source voltage VDD, and the gate and drain thereof are connected to a node N14. The source of the P-channel CMOS transistor Qp12 is connected to the source voltage VDD, the gate thereof is connected to the node N14, and the drain thereof is connected to the output node VREFA. The gate of the N-channel CMOS transistor Qn11 is connected to the node N15, the source thereof is connected to the ground voltage VSS, and the drain thereof is connected to the node N14.

The nodes N11 and N13 are connected to the input terminal of the differential amplifier circuit 7, and the node N15 is connected to the output terminal of the circuit. When the node N13 is higher than the node N11 in voltage, a logical voltage "H" is generated. When the node N13 is lower, a logical voltage "L" is generated.

The resistance element R11 has an end connected to the output node VREFA and the other end connected to the node N11. The resistance element R12 has an end connected to the node N11 and the other end connected to the node N12. The resistance element R13 has an end connected to the output node VREF and the other end connected to the node N13.

The diode Di01 has P-diffusion connected to the node N13 and N-diffusion connected to the ground voltage VSS. The diode Di02 has P-diffusion connected to the node N12 and N-diffusion connected to the ground voltage VSS.

Assuming that the diode Di01 has a threshold value of Vd, the resistance elements R11, R12, and R13 have resistance values of rs11, rs12, and rs13, and the diodes Di01 and Di02 have saturation currents of Is11 and Is12, the output voltage VREFA of the reference potential generating-circuit 1 is indicated by the following equation (1-1).

$$VREF = Vd + (rs11/rs12)*(k/q)* \quad \text{Equation (1-1)}$$
$$ln\{(Is12/Is11)*$$
$$(rs11/rs13)\}*T$$

Here, reference character k denotes a Boltzmann coefficient, reference character q denotes a charge amount of electrons, and reference character T denotes an absolute temperature.

The above threshold voltage Vd has temperature dependence with negative inclination, which is lower at a higher temperature and is higher at a lower temperature. When a constant voltage of the first term Vd is A1 on the right side of the equation (1-1), a variation made by temperature is αT, a constant voltage of the second term is B1 on the right side of the equation (1-1), and a variation made by temperature is βT, the output voltage VREFA is indicated by the following equation (1-2).

$$VREF = A1 + B1 - \alpha T + \beta T \quad \text{Equation (1-2)}$$

According to equation (1-2), since temperature-dependent coefficients α and β are set at equal values, it is possible to obtain a constant reference potential which considerably decreases in variations caused by process and temperature. Although the above explanation is made using the circuit configuration of FIG. 2, another circuit configuration using diodes and resistance elements is also applicable.

Figure 3:
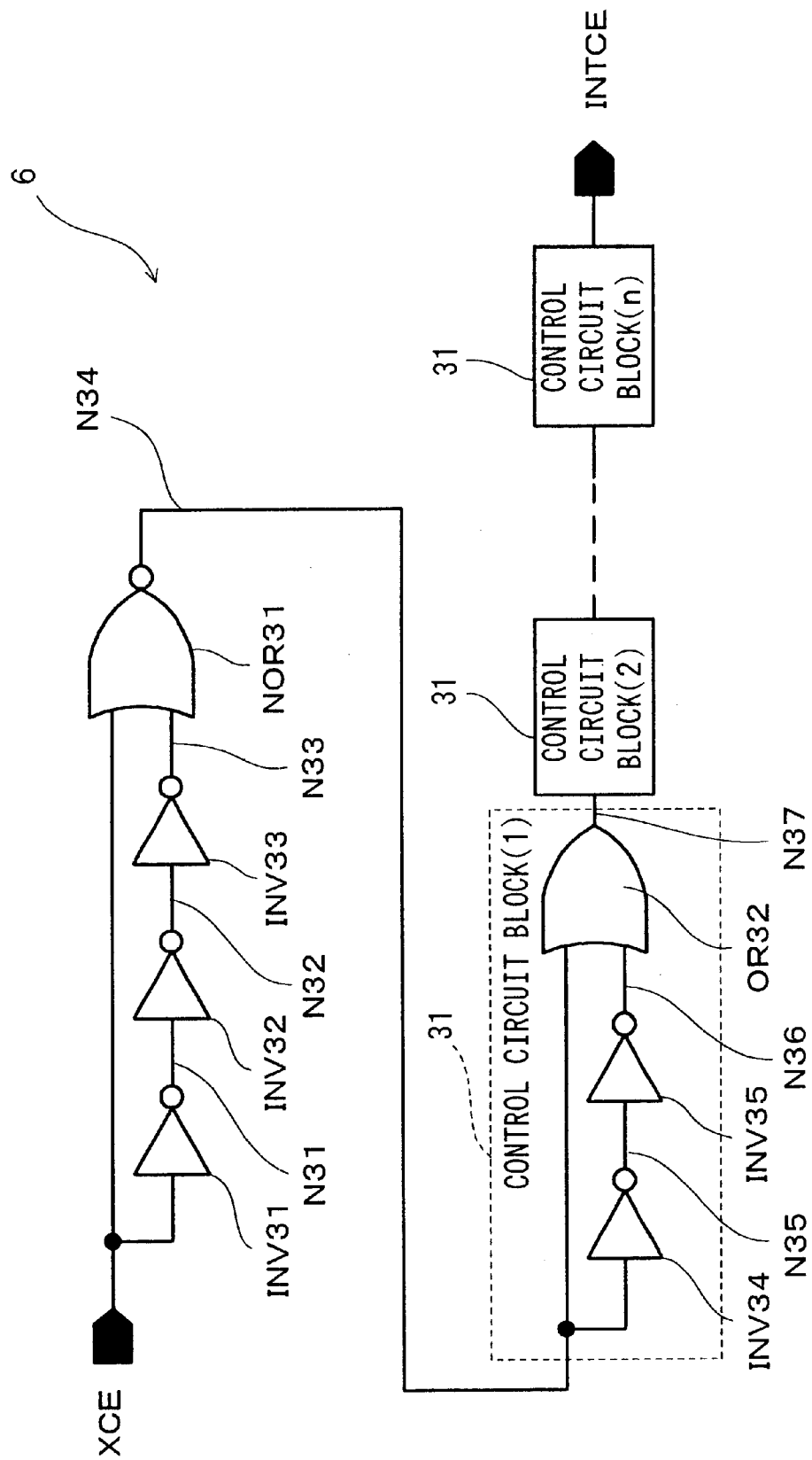
FIG. 3 is a circuit block diagram showing an example of a configuration of an internal CE generating circuit according to Embodiment 1.

FIG. 3 is a circuit block diagram showing an example of a configuration of the internal CE generating circuit 6 in the memory control section of FIG. 1. In FIG. 3, reference numerals INV31 to INV35 denote inverter circuits, reference numeral NOR31 denotes a NOR circuit, and reference numeral OR32 denotes an OR circuit.

The inverter circuits INV31, INV32, and INV33 are connected in series. The inverter circuit INV31 has XCE as an input terminal and N31 as an output terminal, the inverter circuit INV32 has N31 as an input terminal and N32 as an output terminal, and the inverter circuit INV33 has N32 as an input terminal and N33 as an output terminal.

The input of the NOR circuit NOR31 is connected to XCE and N33 and the output thereof is connected to N34. The inverter circuit INV34 and the inverter circuit INV35 are connected in series. The inverter circuit INV34 has N34 as an input terminal and N35 as an output terminal, and the inverter circuit INV35 has N35 as an input terminal and N36 as an output terminal.

The input of the OR circuit OR32 is connected to N34 and N36 and the output thereof is connected to N37. The n control circuit blocks 31 each including INV34, INV35, and OR32 are connected in series and produce a signal INTCE, the signal INTCE has a pulse width determined by an internal self-completing circuit method, which is not dependent upon a pulse width of XCE.

Regarding the ferroelectric memory configured according to Embodiment 1 of the present invention, the following will discuss the operation of controlling the memory in the memory control section.

Figure 4:
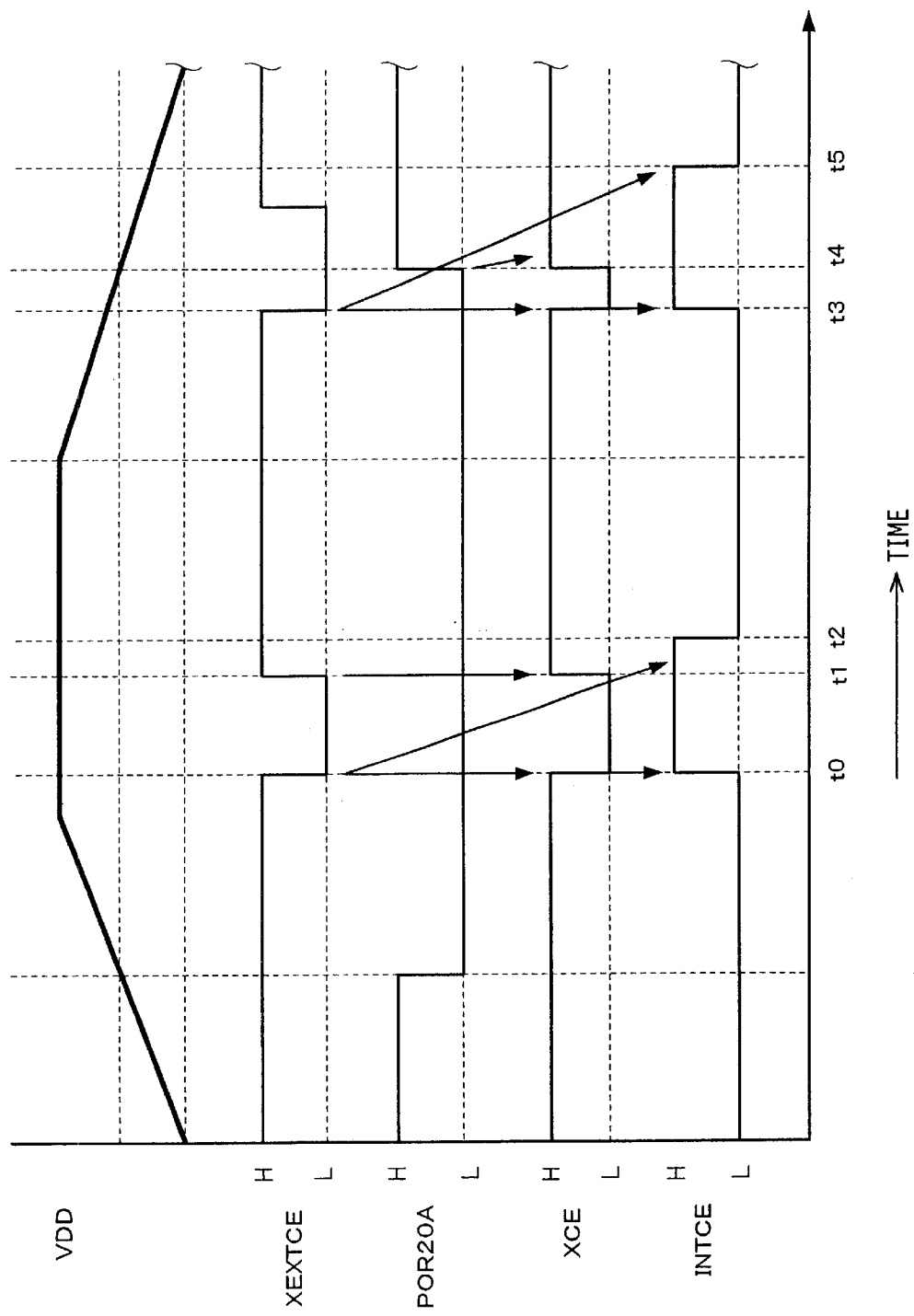
FIG. 4 is a timing chart showing an operation of controlling the memory of Embodiment 1.

FIG. 4 is a timing chart showing the operation of controlling the memory of the memory control section shown in FIG. 1.

The differential amplifier circuit 3 amplifies a potential difference between a reference potential VREFA and a divided potential RREFA based on a source voltage VDD. When the divided potential RREFA is lower than a reference potential VREFA (when a source voltage VDD is at or lower than a detected voltage), POR20A outputs a logical voltage "H". In contrast, when a divided potential RREFA is higher than a reference potential VREFA (when a source VDD exceeds a detected voltage), POR20A outputs a logical voltage "L".

Therefore, in the case where a source voltage VDD is at or lower than a detected voltage when the power is turned on, POR20A has a logical voltage "H" and the control signal XCE can be fixed at "H" level regardless of a state of the external input control signal XEXTCE. Hence, it is possible to prevent a malfunction of the internal circuit and protect data.

Next, in the case where a source voltage VDD is at or lower than a detected voltage when the power is turned off, except during the operation, no affection is made by the external input control signal XEXTCE like when the power is turned on. Even during the operation, the control signal XCE sets a logical voltage of the POR20A at "H" and is fixed at "H" level regardless of the state of the external input control signal XEXTCE, and XCE has a short width of t3 to t4. However, since the internal CE (INTCE) generating circuit 6 is configured as shown in FIG. 3, as shown in the timing chart of FIG. 4, it is possible to produce a constant pulse width of t3 to t5 regardless of the "L" period of XEXTCE.

Therefore, even in the case where a source voltage VDD is at or lower than a detection level when the signal XEXTCE is in "L" period, i.e., in the operating state, the internal circuit control signal INTCE has a constant pulse width and data is protected during the operation.

Further, when POR20A is at a logical voltage "L", the control signal XCE is controlled by the external input control signal XEXTCE and has a pulse width of t0 to t1 and a normal operation is performed. Thus, the internal circuit control signal INTCE can produce a constant pulse width of t0 to t2.

Assuming that a reference potential VREFA is at 1.2 V and a ratio of resistors R1 and R2 is 1:1, a detection level is at a point of a source voltage of 2.4 V. When a source voltage is at 2.4 V or lower, the signal POR20A has a logical voltage value "H", and when a source voltage exceeds 2.4 V, the signal POR20A has a logical voltage value of "L".

As described above, according to the configuration of the above circuit, it is possible to suppress variations in detection level that are resulted from fluctuations in process parameter and temperature. When a source voltage is at a set voltage or lower in the initial state, it is possible to protect data in a stable manner without mistakenly entering the operating state, by deactivating the input signal.

Moreover, when a source voltage is at a set voltage or lower in the operating state, the input signal is deactivated and the reading and writing operations are normally completed during the operation. Thus, it is possible to protect data in a stable manner without mistakenly entering a subsequent operating state.

Embodiment 2

A ferroelectric memory will be discussed according to Embodiment 2 of the present invention.

Figure 5:
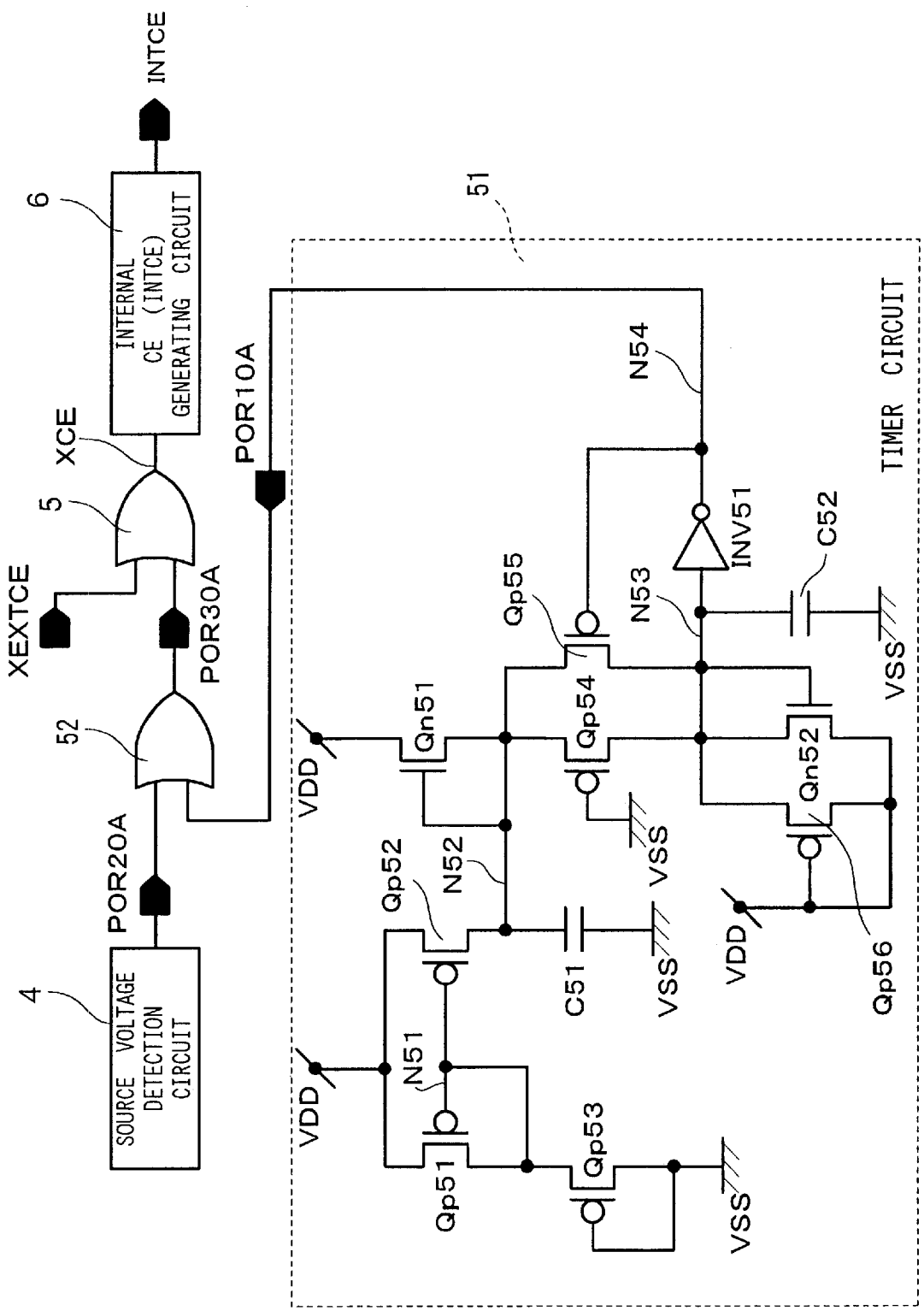
FIG. 5 is a circuit block diagram showing a configuration of a memory control section in a ferroelectric memory according to Embodiment 2 of the present invention.

FIG. 5 is a circuit block diagram showing a configuration of a memory control section in the ferroelectric memory of Embodiment 2. In FIG. 5, reference numeral 4 denotes a source voltage detection circuit, which is identical to that of Embodiment 1. Reference numeral POR20A denotes an output signal node of the source voltage detection circuit 4. Reference numeral 52 denotes an OR circuit which has the input connected to the nodes POR20A and POR10A and the output connected to a node POR30A, and outputs an OR of the nodes POR20A and POR10A. Reference character XEXTCE denotes an external input control signal for activating the internal circuit at a logical voltage "L" level. Reference numeral 5 denotes an OR circuit for outputting an OR of the external input control signal XEXTCE and the output node POR30A. Reference character XCE denotes an output node of the OR circuit 5. Reference character INTCE denotes an internal circuit control signal for controlling the internal circuit. Reference numeral 6 denotes an internal CE generating circuit for producing the internal circuit control signal INTCE from the node XCE. Reference numeral 51 denotes a timer circuit for producing a signal from the node POR10A only when the power is turned on. Reference numerals Qp51 to Qp56 denote P-channel CMOS transistors. Reference numerals Qn51 and Qn52 denote N-channel CMOS transistors. Reference numeral INV51 denotes an inverter circuit. Reference numerals C51 and C52 denote capacitor elements.

The sources of the P-channel CMOS transistors Qp51 and Qp52 are connected to the source voltage VDD. The gate and drain of Qp51 are connected to a node N51. The gate of Qp52 is connected to a node N51 and the drain thereof is connected to a node N52. The source of P-channel CMOS transistor Qp53 is connected to the node N51, and the gate and drain thereof are connected to a ground voltage VSS. Here, the capacitor element C51 connects the node N52 and the ground voltage VSS.

The gate and source of the N-channel CMOS transistor Qn51 are connected to the node N52 and the drain thereof is connected to the source voltage VDD. Between the nodes N52 and N53, the P-channel CMOS transistor Qp54 whose gate is a ground voltage VSS and the P-channel CMOS transistor Qp55 whose gate is connected to the node N54 are connected in parallel. The inverter circuit INV51 has the input connected to the node N53 and the out put connected to the node N54. Here, the capacitor element C52 is connected between the node N53 and the ground voltage VSS.

The gate and source of the P-channel CMOS transistor Qp56 are connected to the source voltage VDD and the drain thereof is connected to the node N53. The gate and source of the N-channel CMOS transistor Qn52 are connected to the node N53 and the drain thereof is connected to the source voltage VDD.

In this circuit, charge is supplied to the node N52, which is connected to the capacitor element C51, via the P-channel CMOS transistor Qp52 which is reduced in current, and a voltage source slowly increases a voltage of the node N52.

The inverter circuit INV51 receives a voltage of the node N53 that is determined by charge supplied from the node N52, and a detected voltage POR10A is generated in the node N54. Here, a switching level of the inverter circuit INV51 is set high.

When the power is turned on, in the initial state, a potential level of the node N53 is "L" and charge is supplied with the passage of time. When the node N53 exceeds a switching level of the inverter circuit INV51, the signal POR10A is changed from "H" to "L". Time from when the power is turned on to when the signal POR10A is changed from "H" to "L" is determined by capacitances of the capacitor elements C51 and C52 and a current capability of the P-channel CMOS transistors Qp52 and Qp54.

As described above, in the ferroelectric memory of Embodiment 2, the OR circuit 5 is controlled by the OR signal POR30A of the output signal POR20A of Embodiment 1 and the output POR10A of the circuit shown in FIG. 5. When the power is turned on, the detection signal POR10A is outputted. When the power is turned-off, the detection signal POR10A is not outputted.

Such a circuit configuration makes it possible to achieve a stable operation particularly for the protection of data when the power is turned on.

Embodiment 3

The following will discuss a ferroelectric memory according to Embodiment 3 of the present invention.

Figure 6:
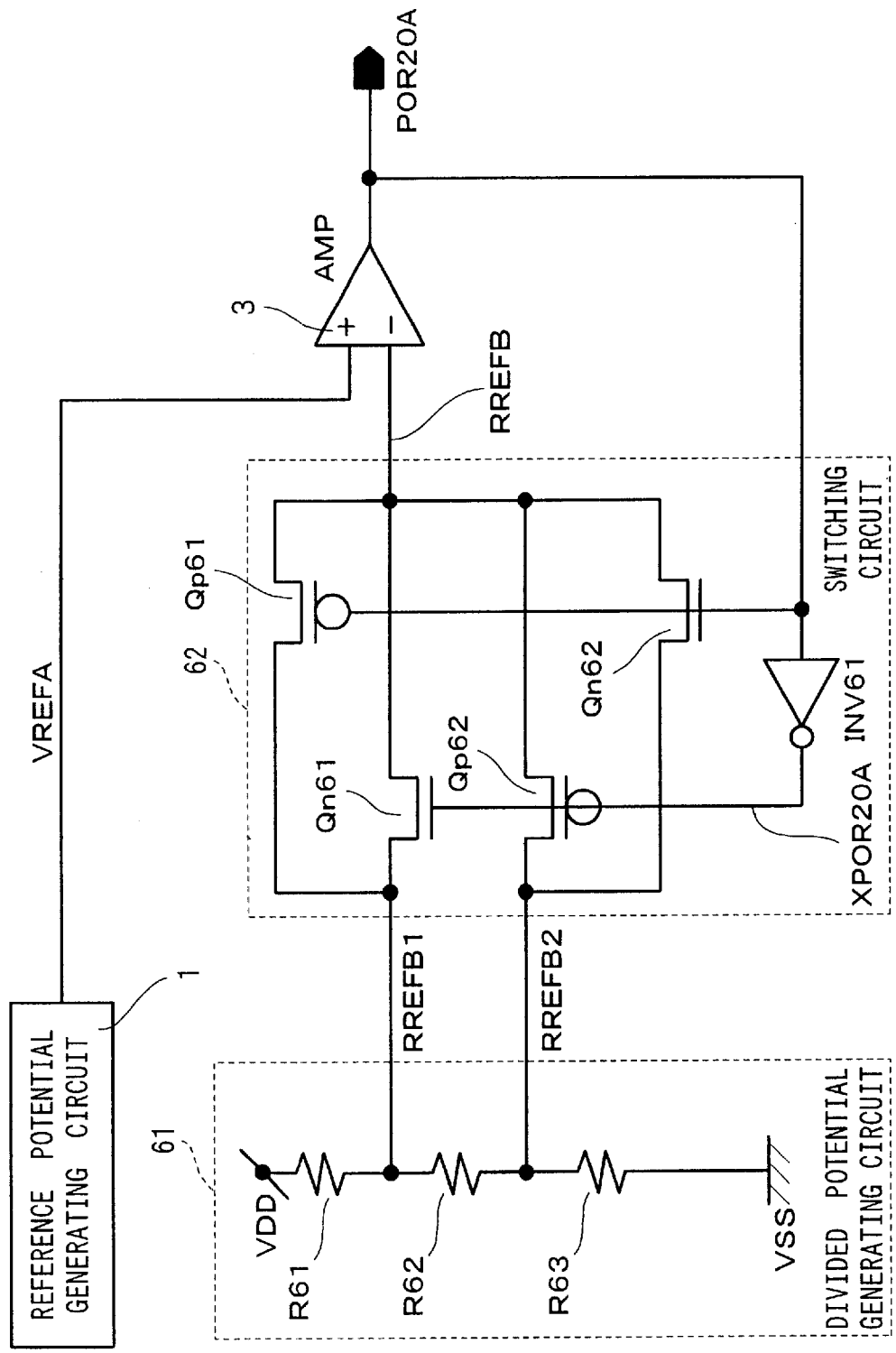
FIG. 6 is a circuit block diagram showing a configuration of a source voltage detection circuit in a ferroelectric memory according to Embodiment 3 of the present invention.

FIG. 6 is a circuit block diagram showing a configuration of a source voltage detection circuit in the ferroelectric memory of Embodiment 3. In FIG. 6, reference numeral 1 denotes a reference potential generating circuit which is identical to that of Embodiment 1. Reference character VREFA denotes a reference potential output node of the reference potential generating circuit 1. Reference numeral 61 denotes a divided potential generating circuit for generating a divided potential according to a source voltage VDD. Reference numerals RREFB1 and RREFB2 denote output nodes of the divided potential generating circuit 61. Reference numerals R61, R62, and R63 denote resistance elements. Reference character VDD denotes a source voltage. Reference character VSS denotes a ground voltage. Reference numeral 62 denotes a switching circuit controlled by the signal POR20A. Reference numerals Qp61 and Qp62 denote P-channel CMOS transistors. Reference numerals Qn61 and Qn62 denote N-channel CMOS transistors. Reference numeral INV61 denotes an inverter circuit. Reference numeral 3 denotes a differential amplifier circuit for amplifying a potential difference between the output node VREFA of the reference potential generating circuit 1 and the output node RREFB of the switching circuit 62. Reference numeral POR20A denotes an output node of the differential amplifier circuit 3.

The resistance element R61 has an end connected to the source voltage VDD and the other end connected to the output node RREFB1. The resistance element R62 has an end connected to the node RREFB1 and the other end connected to the output node RREFB2. The resistance element R63 has an end connected to the ground voltage VSS and the other end connected to the output node RREFB2.

Qp61 has the gate connected to POR20A, the drain connected to RREFB1 and the source connected to the RREFB. Qn61 has the gate connected to XPOR20A, the drain connected to RREFB1, and the source connected to RREFB. Qp62 has the gate connected to XPOR20A, the drain connected to RREFB2, and the source connected to RREFB. Qn62 has the gate connected to POR20A, the drain connected to RREFB2, and the source connected to RREFB. The inverter circuit INV61 has the input connected to POR20A and the output connected to XPOR20A.

In the above configuration, when a source voltage VDD is at or lower than a detected voltage, since POR20A has a logical voltage of "H", when the power is turned on, RREFB=RREFB2 is obtained. When the power is turned off, RREFB=RREFB1 is obtained.

In the circuit configuration of Embodiment 3, since RREFB1>RREFB2 is set, a detected potential is set higher when the power is turned on as compared with when the power is turned off. Once the source voltage detection signal POR20A is set at "H", it is less likely to return to "L" even when the source voltage is varied.

Namely, in the ferroelectric memory of Embodiment 3, the switching circuit 62 controlled by a level of a logical voltage value of POR20A is used and the detection level has hysteresis. Thus, it is possible to improve resistance against fluctuations in source voltage, particularly fluctuations in source voltage around the detected voltage. This circuit is applicable to the source voltage detection circuits of Embodiments 1 and 2.

Embodiment 4

The following will discuss a ferroelectric memory according to Embodiment 4 of the present invention.

Figure 7:
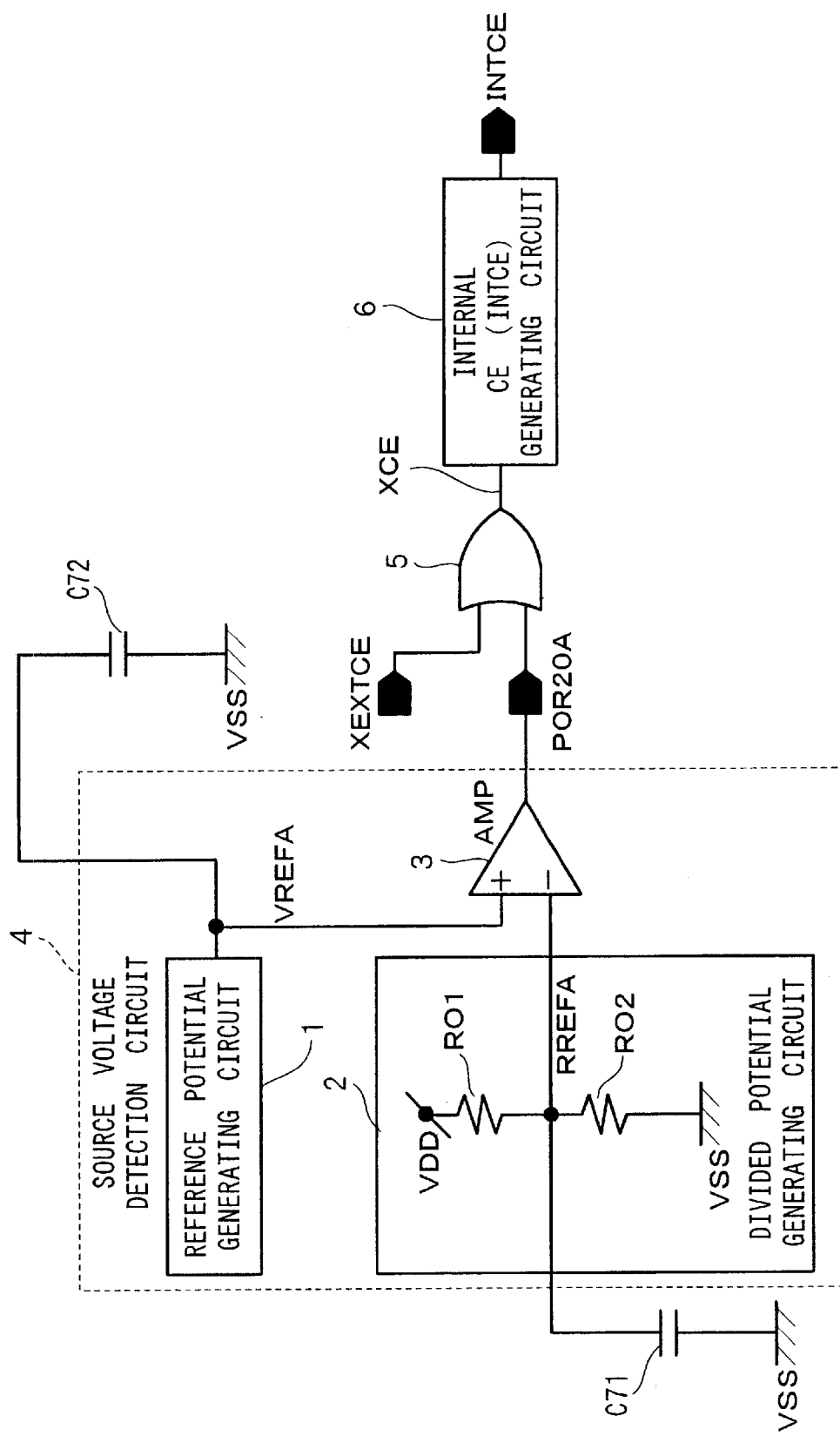
FIG. 7 is a circuit block diagram showing a memory control section in a ferroelectric memory according to Embodiment 4 of the present invention.

FIG. 7 is a circuit block diagram showing a configuration of a memory control section in the ferroelectric memory of Embodiment 4. In FIG. 7, reference numeral 1 denotes a reference potential generating circuit which is identical to that of Embodiment 1. Reference character VREFA denotes a reference potential output node of the reference potential generating circuit 1. Reference numeral 2 denotes a divided potential generating circuit for generating a divided potential being equal to that of Embodiment 1. Reference character RREFA denotes an output node of the divided potential generating circuit 2. Reference numerals R01 and R02 denote resistance elements. Reference character VDD denotes a source voltage. Reference character VSS denotes a ground voltage. Reference numeral 3 denotes a differential, amplifier circuit for amplifying a potential difference between the output node VREFA of the reference potential generating circuit 1 and the output node RREFA of the divided potential generating circuit 2. Reference numeral POR20A denotes an output node of the differential amplifier circuit 3. Reference numeral 4 denotes a source voltage detection circuit including the above circuits 1, 2, and 3. Reference character XEXTCE denotes an external input control signal which activates the internal circuit at a logical voltage "L". Reference numeral 5 denotes an OR circuit for outputting an OR of the external input control signal XEXTCE and the output node POR20A. Reference character XCE denotes an output node of the OR circuit 5. Reference character INTCE denotes an internal circuit control signal for controlling the internal circuit. Reference numeral 6 denotes an internal CE generating circuit for producing the internal circuit control signal INTCE from XCE. Reference numerals C71 and C72 denote capacitor elements.

The ferroelectric memory of Embodiment 4 is configured such that the capacitor elements C71 and C72 are intentionally added as additional circuits to the resistors of the reference potential generating circuit 1 and the divided potential generating circuit 2. It is possible to suppress fluctuations in the reference potential VREFA and the divided potential RREFA, that are resulted from fluctuations in source. It is possible to improve noise resistance against fluctuations in source, particularly fluctuations in source around the detected voltage. This circuit is applicable to the reference potential generating circuits and the divided potential generating circuits of Embodiments 1, 2, and 3.

Embodiment 5

The following will discuss a ferroelectric memory according to Embodiment 5 of the present invention.

Figure 8:
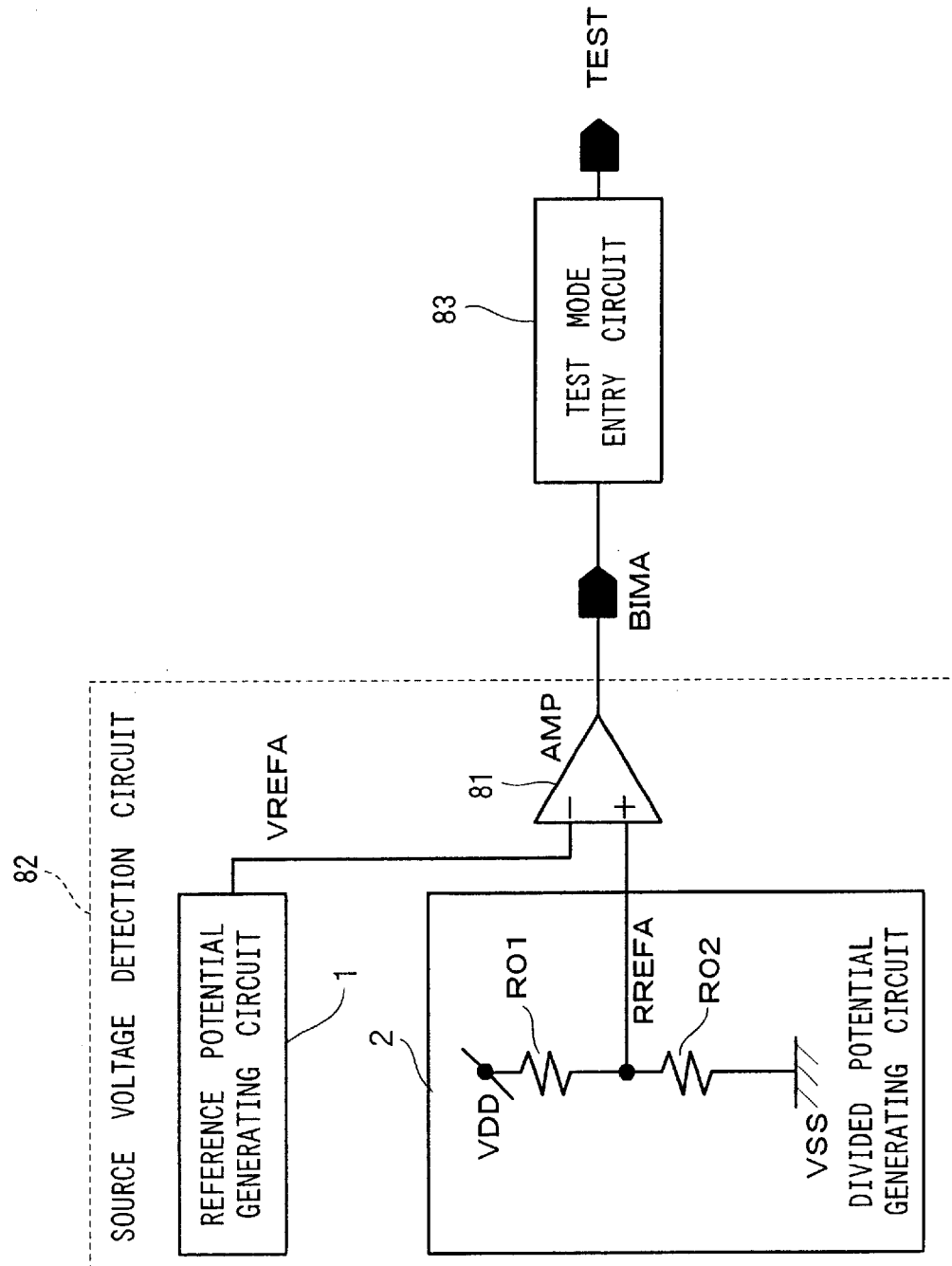
FIG. 8 is a circuit block diagram showing a configuration of a memory control section in a ferroelectric memory according to Embodiment 5 of the present invention.

FIG. 8 is a circuit block diagram showing a memory control section in the ferroelectric memory of Embodiment 5. In FIG. 8, reference numeral 1 denotes a reference potential generating circuit which is identical to that of Embodiment 1. Reference character VREFA denotes a reference potential output node of the reference potential generating circuit 1. Reference numeral 2 denotes a divided potential generating circuit for generating a divided potential being equal to that of Embodiment 1. Reference character RREFA denotes an output node of the divided potential generating circuit 2. Reference numerals R01 and R02 denote resistance elements. Reference character VDD denotes a source voltage. Reference character VSS denotes a ground voltage. Reference numeral 81 denotes a differential amplifier circuit for amplifying a potential difference between the output node VREFA of the reference potential generating circuit 1 and the output node RREFA of the divided potential generating circuit 2. Reference character BIMA denotes an output node of the differential amplifier circuit 81. Reference numeral 82 denotes a source voltage detection circuit including the above circuits 1, 2, and 81. Reference numeral 83 denotes a test mode entry circuit for entering a test mode based on a state of logical voltage of the output node BIMA in the differential amplifier circuit 81.

When the divided potential RREFA is lower than the reference potential VREFA, BIMA outputs a logical voltage "L". In contrast, when the divided potential RREFA is higher than the reference potential VREFA, BIMA outputs a logical voltage "H".

Regarding the test mode entry circuit 83, when a source voltage VDD higher than a set detection level is applied and the output node BIMA of the differential amplifier circuit 81 is changed from "L" potential to "H" potential, the entry to the test mode is possible.

Assuming that a reference potential VREFA is 1.2 V, a ratio of the resistors R01 and R02 is 3:1, the detection level is at a point of source voltage of 4.8 V. When a source voltage is 4.8 V or lower, the signal BIMA has a logical voltage value of "L". When a source voltage is higher than 4.8 V, the signal BIMA has a logical voltage value of "H". When the signal BIMA has a logical voltage value of "H", the entry to the test mode is made possible by the test mode entry circuit 83.

With this circuit configuration, the entry to the test mode is possible without the necessity for a terminal used for test mode entry. Further, when mounting the circuits described in Embodiments 1 to 4, only the differential amplifier 81 and the test mode entry circuit 83 are added. Thus, it is possible to suppress an increase in circuit size and to readily achieve the entry to the test mode.

Moreover, since a detected potential is set at a voltage other than a voltage guaranteed by a product specification (e.g., an extremely high voltage or low voltage), the entry to the test mode is possible when the above voltage is detected, and a test mode such as improving efficiency of evaluation can be produced with ease. Consequently, it is possible to prevent an entry error during the usage of a customer.

Embodiment 6

The following will discuss a ferroelectric memory according to Embodiment 6 of the present invention.

Figure 9:
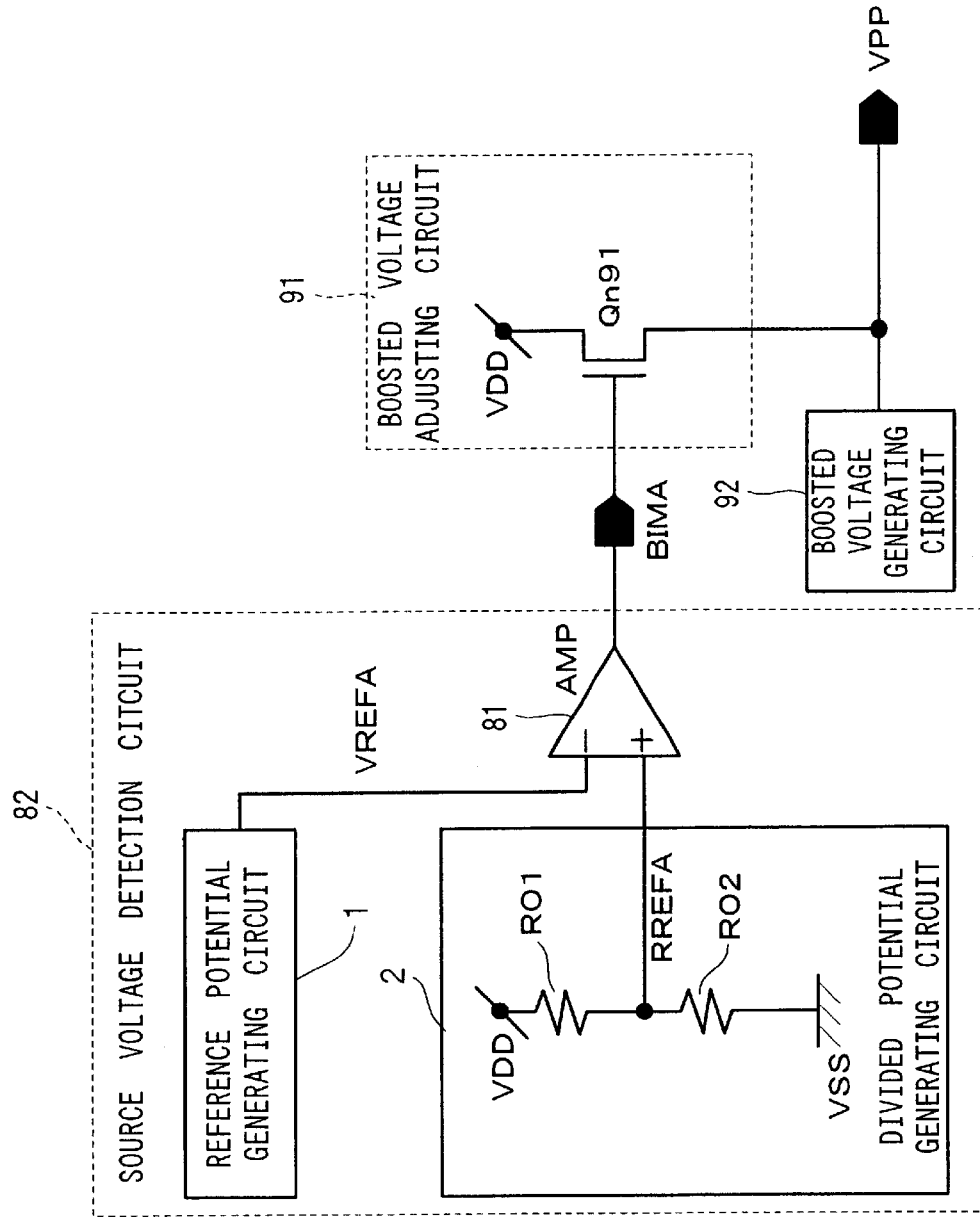
FIG. 9 is a circuit block diagram showing a configuration of a memory control section in a ferroelectric memory according to Embodiment 6 of the present invention.
Figure 10:
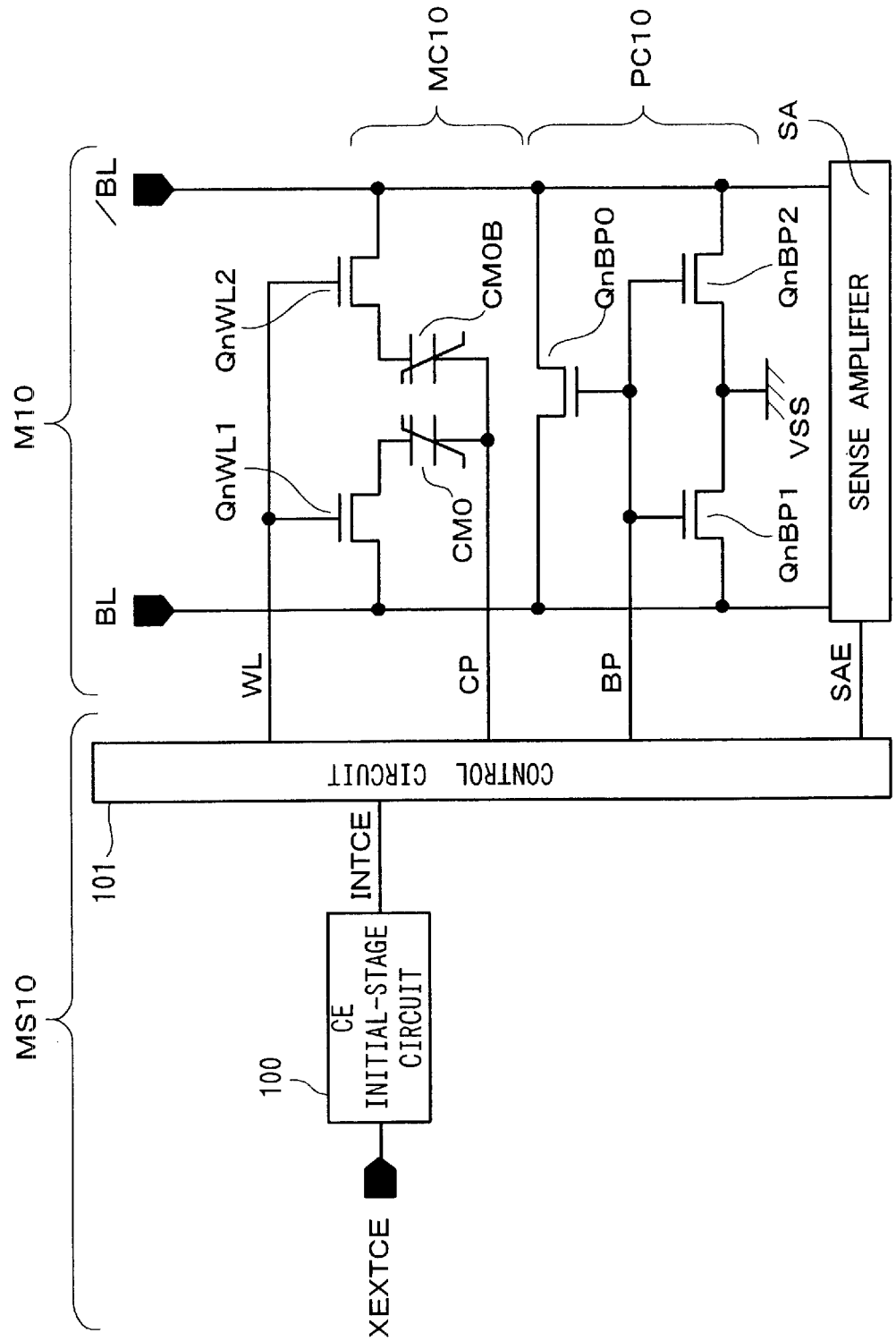
FIG. 10 is a circuit block diagram showing an example of a configuration of a conventional ferroelectric memory.
Figure 11:
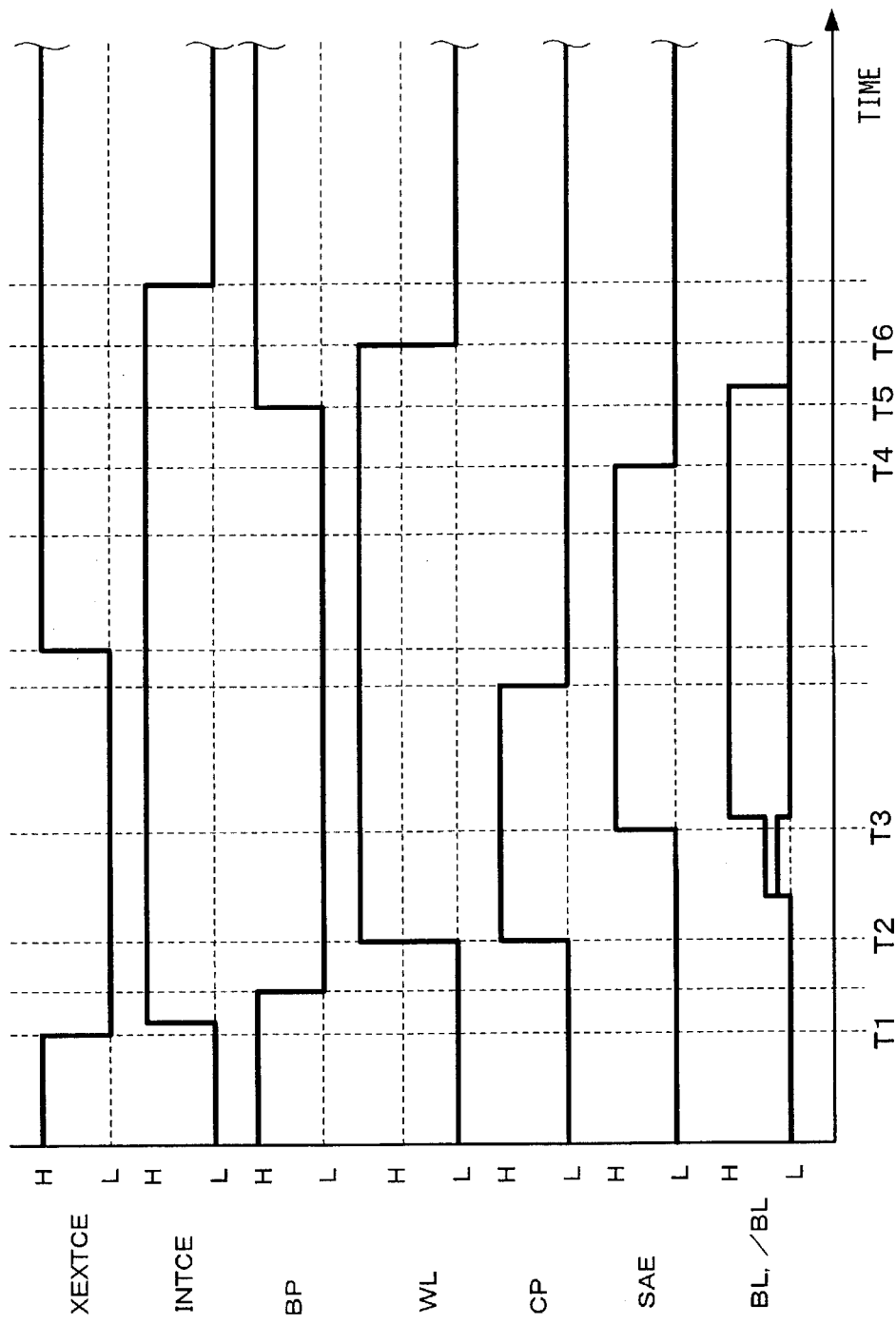
FIG. 11 is a timing chart showing control signals for controlling the memory of the conventional art.
Figure 12:
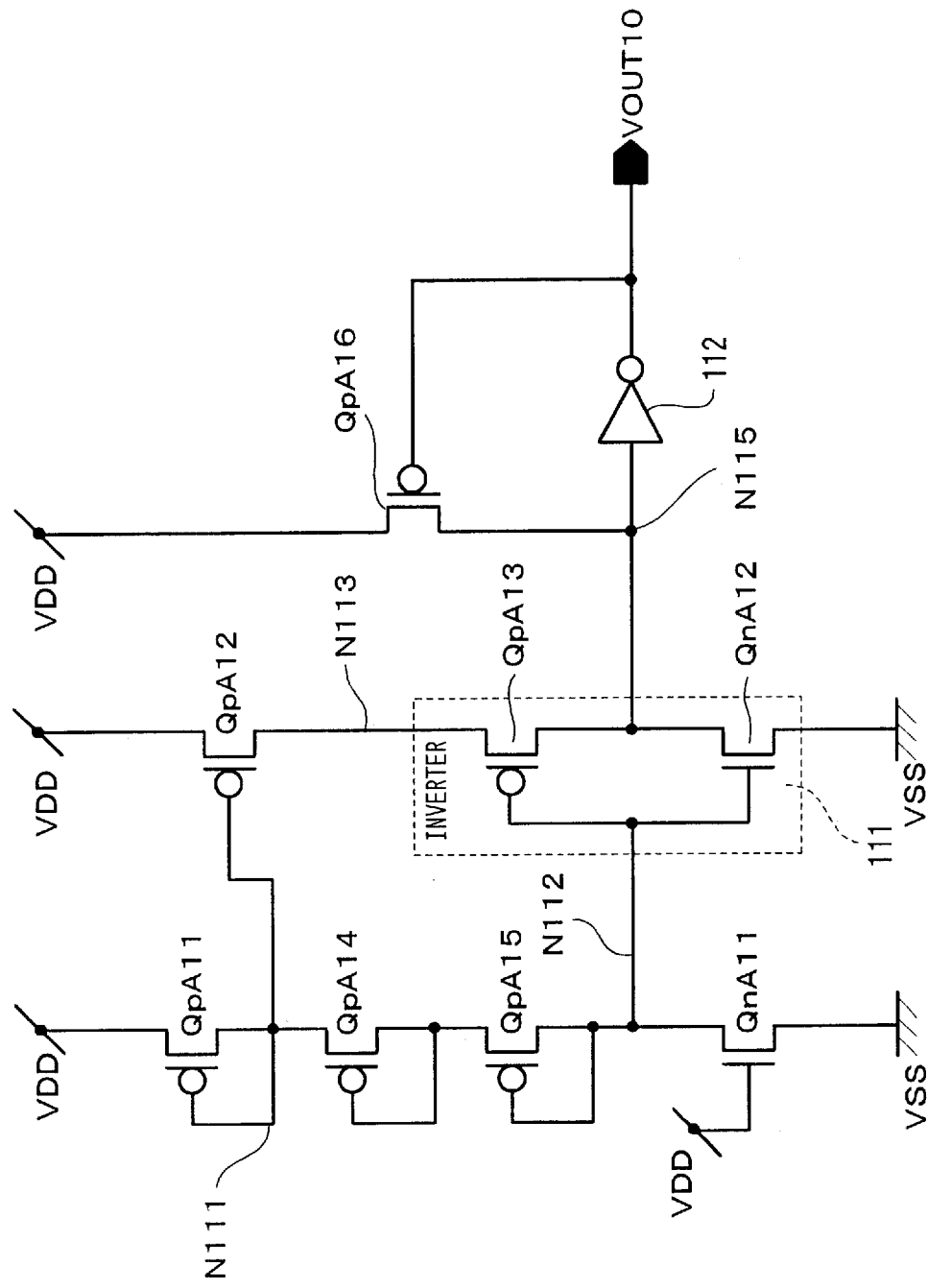
FIG. 12 is a circuit block diagram showing a configuration of a source voltage detection circuit for controlling the memory of the conventional art.

FIG. 9 is a circuit block diagram showing a configuration of a memory control section in the ferroelectric memory of Embodiment 6. In FIG. 9, reference numeral 1 denotes a reference potential generating circuit which is identical to that of Embodiment 5. Reference character VREFA denotes a reference potential output node of the reference potential generating circuit 1. Reference numeral 2 denotes a divided potential generating circuit for generating a divided potential being equal to that of Embodiment 5. Reference character RREFA denotes an output node of the divided potential generating circuit 2. Reference numerals R01 and R02 denote resistance elements. Reference character VDD denotes a source voltage. Reference character VSS denotes a ground voltage. Reference numeral 81 denotes a differential amplifier circuit for amplifying a potential difference between the output node VREFA of the reference potential generating circuit 1 and the output node RREFA of the divided potential generating circuit 2, like Embodiment 5. Reference character BIMA denotes an output node of the differential amplifier circuit 81. Reference numeral 82 denotes a source voltage detection circuit including the above circuits 1, 2, and 81, like Embodiment 5. Reference numeral 91 denotes a boosted voltage adjusting circuit. Reference numeral 92 denotes a boosted voltage generating circuit. Reference numeral Qn91 denotes an N-channel CMOS transistor.

With the boosted voltage adjusting circuit 91 and the boosted voltage generating circuit 92, when a voltage at a set detection level or higher is applied, the output node BIMA of the differential amplifier circuit 81 is changed from "L" potential to "H" potential. The output node BIMA is an excessive stress release signal. Thus, it is possible to control an internal boosted voltage at a constant level.

In the ferroelectric memory of Embodiment 6, assuming that the N-channel CMOS transistor Qn91 has a threshold value of Vtn, when a boosted voltage VPP exceeds VDD+Vtn, the boosted voltage VPP and the source voltage VDD are connected to each other via the N-channel CMOS transistor Qn91. Thus, the boosted voltage VPP can be controlled at a potential level of VDD+Vtn.

Since a detected potential is set at a voltage much higher than a voltage guaranteed by a product specification, even when a high-voltage stress is applied to the device, it is possible to prevent excessive stress. Hence, breakage can be prevented under excessive stress of source voltage.

Besides, as for the circuit configurations of Embodiments 5 and 6, the circuit configurations of Embodiments 3 and 4 are adopted, in which a detection level is set higher when the power is turned on as compared with when the power is turned off, the detection level has hysteresis, and the capacitor elements are added intentionally, to improve noise resistance against fluctuations in source. Hence, it is also possible to prevent a malfunction caused by fluctuations in source voltage.

What is claimed is:

1. A ferroelectric memory, in which data is stored by allowing an internal control signal produced based on an external input control signal to conform electrical polarization of a ferroelectric capacitor to a logical state of data, comprising a memory control section including:
    a divided potential generating circuit for generating a divided potential, which is divided based on a source voltage with a constant ratio;
    a reference potential generating circuit for generating a constant reference potential, which is independent of the source voltage, the constant reference potential being in accordance with a predetermined detection level for the source voltage;
    a differential amplifier circuit for outputting logical voltage according to a potential difference between the reference potential and the divided potential; and
    control signal producing means for producing the internal control signal based on the external input control signal and a logical voltage from the differential amplifier circuit,
    wherein the memory control section is configured such that when the source voltage is detected as being lower than the detection level based on a logical voltage from the differential amplifier circuit, regardless of the state of said external input control signal, the stored data is protected with the internal control signal produced based on a logical voltage from the differential amplifier circuit.

2. A ferroelectric memory, in which data is stored by allowing an internal control signal produced based on an external input control signal to conform electrical polarization of a ferroelectric capacitor to a logical state of data, comprising a memory control section. including:
    a divided potential generating circuit for generating a divided potential, which is divided based on a source voltage with a constant ratio;
    a reference potential generating circuit for generating a constant reference potential, which is independent of the source voltage, the constant reference potential being in accordance with a predetermined detection level for the source voltage;
    a differential amplifier circuit for outputting logical voltage according to a potential difference between the reference potential and the divided potential;
    power supply detection means for outputting a detection signal of the power supply only for a fixed time after the power is turned on for supplying the source voltage; and
    control signal producing means for producing the internal control signal based on the external input control signal, the power supply detection signal, and a logical voltage from the differential amplifier circuit,
    wherein the memory control section is configured such that when the source voltage is detected as being lower than the detection level based on a logical voltage from the differential amplifier circuit or when the power supply is detected by the power supply detection signal, regardless of the state of said external input control signal, the stored data is protected with the internal control signal produced based on the power supply detection signal and a logical voltage from the differential amplifier circuit.

3. The ferroelectric memory according to claim 1, wherein as a predetermined detection level relative to a source voltage, a detection level is set higher when the power is turned on as compared with when the power is turned off.

4. The ferroelectric memory according to claim 1, wherein capacitor elements are connected as additional circuits to the output nodes of the reference potential generating circuit and the divided potential generating circuit.

5. A ferroelectric memory, in which data is stored by allowing an internal control signal to conform electrical polarization of a ferroelectric capacitor to a logical state of data, comprising a memory control section including:
    a divided potential generating circuit for generating a divided potential, which is divided based on a source voltage with a constant ratio;
    a reference potential generating circuit for generating a constant reference potential, which is independent of the source voltage, the constant reference potential being in accordance with a predetermined detection level for the source voltage;
    a differential amplifier circuit for outputting logical voltage according to a potential difference between the reference potential and the divided potential; and
    a test mode entry circuit for outputting a test mode signal based on a logical voltage from the differential amplifier circuit, the test mode signal allowing an entry of a test mode being different from a normal operation, wherein the memory control section is configured such that when the source voltage is detected as being higher than the detection level based on a logical voltage from the differential amplifier circuit, the entry of the test mode is allowed according to a logical voltage from the differential amplifier circuit.

6. A ferroelectric memory, in which data is stored by allowing an internal control signal to conform electrical polarization of a ferroelectric capacitor to a logical state of data, comprising a memory control section including:

a divided potential generating-circuit for generating a divided potential, which is divided based on a source voltage with a constant ratio;

a reference potential generating circuit for generating a constant reference potential, which is independent of the source voltage, the constant reference potential being in accordance with a predetermined detection level for the source voltage;

a differential amplifier circuit for outputting logical voltage according to a potential difference between the reference potential and the divided potential; and a booster circuit for outputting a boosted voltage signal, which is controlled in a direction of boosting a potential, based on a logical voltage from the differential amplifier circuit, wherein the memory control section is configured such that when the source voltage is detected as being higher than the detection level based on a logical voltage from the differential amplifier circuit, an output potential of the booster circuit is controlled according to a logical voltage from the differential amplifier circuit.

7. The ferroelectric memory according to claim 5, wherein as a predetermined detection level relative to a source voltage, a detection level is set higher when the power is turned on as compared with when the power is turned off.

8. The ferroelectric memory according to claim 5, wherein capacitor elements are connected as additional circuits to the output nodes of the reference potential generating circuit and the divided potential generating circuit.

* * * * *